(12) United States Patent
Nakazawa et al.

(10) Patent No.: US 7,714,359 B2
(45) Date of Patent: May 11, 2010

(54) FIELD EFFECT TRANSISTOR HAVING NITRIDE SEMICONDUCTOR LAYER

(75) Inventors: Satoshi Nakazawa, Osaka (JP); Tetsuzo Ueda, Osaka (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 973 days.

(21) Appl. No.: 11/355,939

(22) Filed: Feb. 17, 2006

(65) Prior Publication Data
US 2006/0180831 A1 Aug. 17, 2006

(30) Foreign Application Priority Data
Feb. 17, 2005 (JP) ............... 2005-041336

(51) Int. Cl.
*H01L 31/072* (2006.01)
*H01L 31/109* (2006.01)
*H01L 31/0328* (2006.01)
*H01L 31/0336* (2006.01)

(52) U.S. Cl. ............... 257/192; 257/262; 257/E29.229

(58) Field of Classification Search ............... 257/40, 257/191, 192, 213, 262, E29.194, E29.229, 257/E21.574
See application file for complete search history.

(56) References Cited

FOREIGN PATENT DOCUMENTS

| JP | 2002-289837 A | 4/2002 |
|---|---|---|
| JP | 2004-22563 A | 1/2004 |

OTHER PUBLICATIONS

T. Egawa, et al., "Recessed gate AlGaN/GaN modulation-doped field-effect transistors on sapphire," Applied Physics Letters, Jan. 3, 2000, pp. 121-123, vol. 76, No. 1, American Institute of Physics.
O. Amabacher, et al., "Two dimensional electron gases induced by spontaneous and piezoelectric polarization in undoped and doped AlGaN/GaN heterstructures," Journal of Applied Physics, Jan. 1, 2000, pp. 334-344, vol. 87, No. 1, American Institute of Physics.

*Primary Examiner*—Ngan Ngo
*Assistant Examiner*—Dilinh P Nguyen
(74) *Attorney, Agent, or Firm*—McDermott Will & Emery LLP

(57) ABSTRACT

A field effect transistor includes a nitride semiconductor layer; an $In_xAl_yGa_{1-x-y}N$ layer (wherein $0<x<1$, $0<y<1$ and $0<x+y<1$) formed on the nitride semiconductor layer; and a source electrode and a drain electrode formed on and in contact with the $In_xAl_yGa_{1-x-y}N$ layer. The lower ends of the conduction bands of the nitride semiconductor layer and the $In_xAl_yGa_{1-x-y}N$ layer are substantially continuous on the interface therebetween.

12 Claims, 11 Drawing Sheets

| | In COMPOSITION [%] | Al COMPOSITION [%] | Eg[eV] | BOWING PARAMETER[eV] |
|---|---|---|---|---|
| Sample A | 9 | 32 | 3.46 | 2.3 |
| Sample B | 11 | 40 | 3.62 | 2.5 |
| Sample C | 12 | 43 | 3.55 | 3.0 |

FIELD EFFECT TRANSISTOR HAVING NITRIDE SEMICONDUCTOR LAYER

BACKGROUND OF THE INVENTION

The present invention relates to a field effect transistor usable as a high-frequency high-output-power transistor and a method for fabricating the same.

A group III-V nitride compound semiconductor typified by GaN (represented by a general formula, $In_xAl_yGa_{1-x-y}N$ (wherein $0 \leq x \leq 1$ and $0 \leq y \leq 1$) hereinafter referred to as InAlGaN) is regarded as a promising material for a high-frequency high-output-power electronic device because it has a wide band gap (of, for example, 3.4 eV at room temperature in GaN), a very large breakdown electric field and very high saturated electronic velocity. In particular, in a hetero junction structure obtained by stacking an AlGaN film on a GaN film (hereinafter referred to as an AlGaN/GaN hetero structure), electrons are stored in a high concentration in the vicinity of the hetero junction interface within the GaN film owing to a strong polarization electric field formed on the (0001) plane, so as to generate what is called a two-dimensional electron gas. Since the two-dimensional electron gas is three-dimensionally separated from a donor impurity included in the AlGaN film and hence has high electron mobility. Furthermore, a GaN-based material is high at what is called saturated drift velocity, and has electronic velocity twice or more as high as that of a GaAs-based material currently widely used as a material for a high-frequency transistor in a high electric field region of, for example, approximately $1 \times 10^5$ V/cm. Also, the GaN-based material has a large band gap and a large breakdown electric field. Therefore, it is expected to be applied to a high-frequency high-output-power device.

In a field effect transistor having the AlGaN/GaN hetero structure (hereinafter referred to as the HFET (heterojunction field effect transistor)), however, high-frequency characteristics expected based on the material properties have not been attained yet. One of the reasons is large parasitic resistance derived from ohmic resistance, which will now be specifically described. The characteristic parameters of the HFET are cut-off frequency $f_T$ and mutual conductance $g_m$, and there is a relationship represented by the following formula 1 between these parameters:

$$f_T = g_m/(2\pi L_g) \quad \text{Formula 1:}$$

wherein $L_g$ is a gate length. As is obvious from Formula 1, it is significant to increase the mutual conductance $g_m$ for improving the cut-off frequency $f_T$. In consideration of parasitic resistance, the mutual conductance $g_m$ is represented by the following formula 2:

$$g_m = g_{mint}/(1+R_s \cdot g_{mint}) \quad \text{Formula 2:}$$

wherein $g_{mint}$ is intrinsic mutual conductance determined depending upon the material and the structure and $R_s$ is parasitic resistance from an ohmic electrode to a channel and is designated as source resistance. As is understood from Formula 2, the mutual conductance $g_m$ increases as the source resistance $R_s$ reduces, and as a result, the cut-off frequency $f_T$ also increases. Accordingly, in order to improve the high-frequency characteristics of the HFET, it is necessary to reduce the parasitic resistance.

In an AlGaN/GaN-based HFET, an ohmic electrode is formed on AlGaN with a larger band gap, and hence it is difficult to reduce contact resistance. Therefore, a cap layer made of a material with a smaller band gap is conventionally sandwiched between the electrode and the AlGaN so as to reduce the contact resistance. Such a cap layer is conventionally made of GaN (see Non-patent Document 1). In this conventional method, however, a potential barrier is caused between the GaN and the AlGaN because there is a difference in the polarization between the GaN and the AlGaN. As a result, parasitic resistance is increased on the GaN/AlGaN interface, so as to disadvantageously degrade the high-frequency characteristics.

In order to overcome this disadvantage, Patent Document 1 proposes a cap layer made of InAlGaN having a composition matching in lattice with GaN and having larger polarization than AlGaN.

FIG. 9A is a cross-sectional view of a conventional field effect transistor disclosed in Patent Document 1. As shown in FIG. 9A, an undoped GaN buffer layer 102 is formed on a sapphire substrate 101 by epitaxial growth. A two-dimensional electron gas 107 is generated in an upper portion of the undoped GaN buffer layer 102, so that the upper portion of the undoped GaN buffer layer 102 can function as a channel layer of the field effect transistor. An n-type AlGaN electron supply layer 103 and an n-type InAlGaN cap layer 104 are successively formed on the undoped GaN buffer layer 102 by the epitaxial growth. A recess reaching the n-type AlGaN electron supply layer 103 is formed in a given portion of the n-type InAlGaN cap layer 104, and a Schottky electrode 106 made of Pd—Si (namely, an alloy of Pd and Si) working as a gate electrode is formed in the recess. Also, ohmic electrodes 105 made of Ti/Al (namely, having a multilayered structure including a Ti layer and an Al layer) working as a source electrode and a drain electrode are formed on the n-type InAlGaN cap layer 104 on the respective sides of the Schottky electrode 106.

FIG. 9B shows change of Al and In composition along line Y-Y' of FIG. 9A, and FIG. 9C shows change of electron potential energy along line Y-Y' of FIG. 9A.

Non-patent Document 1: T. Egawa, et al., Recessed gate AlGaN/GaN modulation-doped field-effect transistors on sapphire, Applied Physics Letters Vol. 76, pp. 121-123, U.S.A., American Institute of physics, Jan. 3, 2000

Patent Document 1: Japanese Laid-Open Patent Publication No. 2002-289837

SUMMARY OF THE INVENTION

In the conventional field effect transistor disclosed in Patent Document 1, however, there is a large potential barrier on the InAlGaN/AlGaN interface as shown in FIG. 9C, which disadvantageously increases parasitic resistance.

In consideration of the aforementioned conventional disadvantages, an object of the invention is, in a heterojunction field effect transistor, suppressing increase of parasitic resistance on a hetero interface so as to improve transistor characteristics such as high-frequency characteristics.

The present inventors have studied and examined the reason why the large potential barrier is caused on the InAlGaN/AlGaN interface of the conventional field effect transistor, resulting in finding the following: The present inventors have examined in detail and optimized the crystal growth conditions for an InAlGaN layer, and as a result, have found that the bowing parameter of InAlGaN is twice or three times as large as a conventionally known value (that is, approximately 1 eV). FIG. 10 shows the evaluation result of a band gap of $In_{0.09}Al_{0.32}Ga_{0.59}N$ obtained by a cathode luminescence (CL) method. At this point, the energy gap $Eg_{InAlGaN}$ of InAlGaN is represented by the following formula 3:

$$Eg_{InAlGaN} = \text{In composition} \times Eg_{InN} + \text{Al composition} \times Eg_{AlN} + \text{Ga composition} \times Eg_{GaN} - C \times (\text{In composition} + \text{Al composition}) \times \text{Ga composition} \quad \text{Formula 3:}$$

wherein $Eg_{InN}$, $Eg_{AlN}$ and $Eg_{GaN}$ are energy gaps of InN, AlN and GaN, respectively, and C is a bowing parameter. Although the bowing parameter of InAlGaN is conventionally regarded as approximately 1 eV as described above, the bowing parameter obtained from the result shown in FIG. 10 is 2.3 eV. FIG. 11 shows energy gaps Eg and bowing parameters obtained with respect to a plurality of samples of InAlGaN including $In_{0.09}Al_{0.32}Ga_{0.59}N$. These evaluation results reveal that the energy gap does not largely increase even when the Al composition and the In composition of the InAlGaN are increased. As a result, even when a cap layer is made of the InAlGaN having the composition disclosed in Patent Document 1, there is a large potential barrier on the InAlGaN/AlGaN interface as shown in FIG. 9C, so as to cause the problem of the increase of the parasitic resistance.

On the basis of the aforementioned finding, the present inventors have conceived the following: The Al composition of an AlGaN layer is changed so as to avoid a potential barrier between a cap layer and the AlGaN layer, and thus, the increase of parasitic resistance on a hetero interface is suppressed, so that the device characteristics such as high-frequency characteristics can be improved. In other words, according to the present invention, a difference in the lower end of the conduction band between an AlGaN layer and an InAlGaN layer is set to be as small as possible on the interface therebetween, namely, the lower ends of the conduction bands of these layers are set to be substantially continuous on the interface.

Specifically, the field effect transistor of this invention includes a nitride semiconductor layer; an $In_xAl_yGa_{1-x-y}N$ layer (wherein $0<x<1$, $0<y<1$ and $0<x+y<1$) formed on the nitride semiconductor layer; and a source electrode and a drain electrode formed on and in contact with the $In_xAl_yGa_{1-x-y}N$ layer, and lower ends of conduction bands of the nitride semiconductor layer and the $In_xAl_yGa_{1-x-y}N$ layer are substantially continuous on an interface therebetween.

In the field effect transistor of this invention, ohmic electrodes (working as the source electrode and the drain electrode) with very low resistance of $3 \times 10^{-6}$ Ω·cm² or less can be formed on the $In_xAl_yGa_{1-x-y}N$ layer (hereinafter sometimes simply referred to as the InAlGaN layer). Also, since the lower end of the conduction band of the InAlGaN layer working as a cap layer and the lower end of the conduction band of the nitride semiconductor layer working as an electron supply layer are continuous, a potential barrier formed on the interface between the nitride semiconductor layer and the InAlGaN layer can be lowered, so that parasitic resistance can be largely reduced. As a result, the transistor characteristics such as high-frequency characteristics can be improved.

In the field effect transistor of the invention, polarization of the $In_xAl_yGa_{1-x-y}N$ layer is preferably equal to or larger than polarization of the underlying nitride semiconductor layer.

Thus, generation of a depletion layer on the interface between the nitride semiconductor layer and the InAlGaN layer can be suppressed, so that the increase of the potential barrier formed on the interface can be further suppressed. Also, electrons in a high concentration can be supplied to a channel layer, and hence, not only parasitic resistance derived from the potential barrier but also parasitic resistance derived from channel resistance can be reduced.

In the field effect transistor of the invention, a lattice constant of the nitride semiconductor layer is preferably substantially equal to a lattice constant of the $In_xAl_yGa_{1-x-y}N$ layer on the interface therebetween.

Thus, the InAlGaN layer can be formed in a large thickness, and hence, the resistance of the InAlGaN layer can be further reduced, so as to further reduce the parasitic resistance.

In the field effect transistor of the invention, a band gap of the nitride semiconductor layer is preferably substantially equal to a band gap of the $In_xAl_yGa_{1-x-y}N$ layer on the interface therebetween.

Thus, since it is regarded that a difference in the electron affinity between the nitride semiconductor layer and the InAlGaN layer, namely, a potential barrier, is in proportion to a difference in the energy gap between the nitride semiconductor layer and the InAlGaN layer, the potential barrier can be made very small. Therefore, increase of the parasitic resistance derived from the potential barrier can be further suppressed.

In the field effect transistor of the invention, the nitride semiconductor layer preferably includes Al, and Al composition in the nitride semiconductor layer is preferably changed to be larger as a distance from the interface between the nitride semiconductor layer and the $In_xAl_yGa_{1-x-y}N$ layer is larger.

Thus, the lower ends of the conduction bands of the nitride semiconductor layer and the InAlGaN layer can be definitely made continuous on the interface therebetween. Therefore, the interface can be free from a potential barrier, and the increase of the parasitic resistance can be definitely suppressed. The Al composition in the nitride semiconductor layer may be linearly increased as the distance from the interface is larger. Alternatively, the Al composition in the nitride semiconductor layer may be increased in a stepwise manner as the distance from the interface is larger. Alternatively, the Al composition in the nitride semiconductor layer may be increased in a shape of a quadratic curve upward convex.

The field effect transistor of this invention preferably further includes, between the nitride semiconductor layer and the $In_xAl_yGa_{1-x-y}N$ layer, a multilayered film including at least one cycle of a GaN layer and an AlGaN layer alternately stacked.

Thus, the effective potential barrier formed between the InAlGaN layer and the nitride semiconductor layer can be lowered so as to suppress the increase of the parasitic resistance derived from the potential barrier, and also, resistance along a direction parallel to the interface between the InAlGaN layer and the nitride semiconductor layer can be reduced.

The field effect transistor of this invention preferably further includes, between the nitride semiconductor layer and the $In_xAl_yGa_{1-x-y}N$ layer, a multilayered film including at least one cycle of an InAlGaN layer and an AlGaN layer alternately stacked.

Thus, the effective potential barrier formed between the InAlGaN layer and the nitride semiconductor layer can be lowered so as to suppress the increase of the parasitic resistance derived from the potential barrier, and also, the resistance along a direction parallel to the interface between the InAlGaN layer and the nitride semiconductor layer can be reduced.

In the field effect transistor of the invention, the nitride semiconductor layer preferably includes a portion doped with an impurity for providing a conductivity type of the nitride semiconductor layer in such a manner as to form a pulse-shaped profile along a direction vertical to the interface between the nitride semiconductor layer and the $In_xAl_yGa_{1-x-y}N$ layer.

Thus, the conduction band is lowered by the doped impurity, and hence, electrons can easily pass through the potential barrier. Accordingly, the influence of the potential barrier can be reduced, so that the increase of the parasitic resistance can be further suppressed. In this case, a peak concentration of the impurity in the portion of the nitride semiconductor layer is preferably $1 \times 10^{19}$ atoms/cm$^3$ or more.

The field effect transistor of this invention preferably further includes a gate electrode formed in a recess that is provided in a given portion of the $In_xAl_yGa_{1-x-y}N$ layer and reaches the nitride semiconductor layer.

The first method for fabricating a field effect transistor of this invention includes the steps of forming a first nitride semiconductor layer on a substrate; forming, on the first nitride semiconductor layer, a second nitride semiconductor layer having a larger energy gap than the first nitride semiconductor layer; forming, on the second nitride semiconductor layer, an $In_xAl_yGa_{1-x-y}N$ layer (wherein 0<x<1, 0<y<1 and 0<x+y<1); forming a recess reaching the second nitride semiconductor layer in a given portion of the $In_xAl_yGa_{1-x-y}N$ layer; forming a gate electrode within the recess; and forming, on the $In_xAl_yGa_{1-x-y}N$ layer, a source electrode and a drain electrode in contact with the $In_xAl_yGa_{1-x-y}N$ layer, and lower ends of conduction bands of the second nitride semiconductor layer and the $In_xAl_yGa_{1-x-y}N$ layer are substantially continuous on an interface therebetween.

In the first method for fabricating a field effect transistor, ohmic electrodes (corresponding to the source electrode and the drain electrode) with very low resistance of $3 \times 10^{-6}$ Ω·cm$^2$ or less can be formed on the InAlGaN layer. Furthermore, since the lower end of the conduction band of the InAlGaN layer working as a cap layer and the lower end of the conduction band of the second nitride semiconductor layer working as an electron supply layer are continuous, a potential barrier formed on the interface between the second nitride semiconductor layer and the InAlGaN layer can be lowered. Therefore, parasitic resistance can be largely reduced, so as to improve the transistor characteristics such as high-frequency characteristics.

The second method for fabricating a field effect transistor of this invention includes the steps of forming a first nitride semiconductor layer on a substrate; forming, on the first nitride semiconductor layer, a second nitride semiconductor layer with a larger energy gap than the first nitride semiconductor layer; forming a mask layer on a given portion of the second nitride semiconductor layer; selectively forming an $In_xAl_yGa_{1-x-y}N$ layer (wherein 0<x<1, 0<y<1 and 0<x+y<1) on a portion of the second nitride semiconductor layer not covered with the mask layer; forming a recess reaching the second nitride semiconductor layer by removing the mask layer; forming a gate electrode within the recess; and forming, on the $In_xAl_yGa_{1-x-y}N$ layer, a source electrode and a drain electrode in contact with the $In_xAl_yGa_{1-x-y}N$ layer.

In the second method for fabricating a field effect transistor, ohmic electrodes (corresponding to the source electrode and the drain electrode) with very low resistance of $3 \times 10^{-6}$ Ω·cm$^2$ or less can be formed on the InAlGaN layer. Also, the recess for forming a gate electrode can be formed without damaging a channel portion, and hence, increase of parasitic resistance derived from channel resistance can be suppressed.

In the second method for fabricating a field effect transistor of the invention, the mask layer may be made of SiO$_2$.

In the second method for fabricating a field effect transistor of the invention, the mask layer preferably has a larger thickness than the $In_xAl_yGa_{1-x-y}N$ layer.

Thus, the InAlGaN layer can be prevented from being formed on the mask layer, and hence, the dimension of the recess formed by removing the mask layer can be accurately controlled. Accordingly, a fine gate electrode can be formed and hence the channel length can be reduced. As a result, the parasitic resistance derived from the channel resistance can be reduced.

In the second method for fabricating a field effect transistor of the invention, lower ends of conduction bands of the second nitride semiconductor layer and the $In_xAl_yGa_{1-x-y}N$ layer are preferably substantially continuous on an interface therebetween.

Thus, since the lower end of the conduction band of the InAlGaN layer working as a cap layer and the lower end of the conduction band of the second nitride semiconductor layer working as an electron supply layer are continuous, a potential barrier formed on the interface between the second nitride semiconductor layer and the InAlGaN layer can be lowered. Therefore, the parasitic resistance can be largely reduced, so as to improve the transistor characteristics such as high-frequency characteristics.

In this case, or in the first method for fabricating a field effect transistor of the invention, the second nitride semiconductor layer preferably includes Al, and Al composition in the second nitride semiconductor layer is preferably changed to be larger as a distance from the interface between the second nitride semiconductor layer and the $In_xAl_yGa_{1-x-y}N$ layer is larger in the step of forming a second nitride semiconductor layer.

Thus, the lower ends of the conduction bands of the second nitride semiconductor layer and the InAlGaN layer can be definitely made continuous on the interface therebetween. Therefore, the interface can be free from a potential barrier, and the increase of the parasitic resistance can be definitely suppressed. The Al composition in the second nitride semiconductor layer may be linearly increased as the distance from the interface is larger in the step of forming a second nitride semiconductor layer. Alternatively, the Al composition in the second nitride semiconductor layer may be increased in a stepwise manner as the distance from the interface is larger in the step of forming a second nitride semiconductor layer. Alternatively, the Al composition in the second nitride semiconductor layer may be increased in a shape of a quadratic curve upward convex in the step of forming a second nitride semiconductor layer.

The first or second method for fabricating a field effect transistor of the invention preferably further includes, after the step of forming a source electrode and a drain electrode, a step of performing annealing on the substrate, and a temperature for the annealing is preferably lower than a temperature at which the $In_xAl_yGa_{1-x-y}N$ layer is formed.

Thus, crystallinity degradation of the InAlGaN layer otherwise caused in the annealing can be suppressed so as to retain high crystallinity, and therefore, the increase of the parasitic resistance can be suppressed.

The first or second method for fabricating a field effect transistor of the invention preferably further includes, after the step of forming an $In_xAl_yGa_{1-x-y}N$ layer, the steps of doping the $In_xAl_yGa_{1-x-y}N$ layer with an impurity for providing an n-type conductivity type to the $In_xAl_yGa_{1-x-y}N$ layer in such a manner as to attain a higher concentration of the impurity in an uppermost portion of the $In_xAl_yGa_{1-x-y}N$ layer than in another portion thereof; and performing annealing on the substrate at a lower temperature than a temperature at which the $In_xAl_yGa_{1-x-y}N$ layer is formed after the step of doping the $In_xAl_yGa_{1-x-y}N$ layer.

Thus, the impurity concentration in the InAlGaN layer can be increased so as to reduce the resistance of the InAlGaN layer. Also, the crystallinity degradation of the InAlGaN layer otherwise caused in the annealing can be suppressed so as to retain high crystallinity, and therefore, the parasitic resistance can be reduced.

As described so far, when the field effect transistor and the fabrication method for the same of this invention are applied to a high-frequency high-output-power transistor, increase of parasitic resistance on a hetero interface between a compound semiconductor layer and an InAlGaN layer can be suppressed, so as to largely improve the device characteristics such as high-frequency characteristics.

DETAILED DESCRIPTION OF THE INVENTION

Embodiment 1

A field effect transistor and a fabrication method for the same according to Embodiment 1 of the invention will now be described with reference to the accompanying drawings.

Figure 1A:
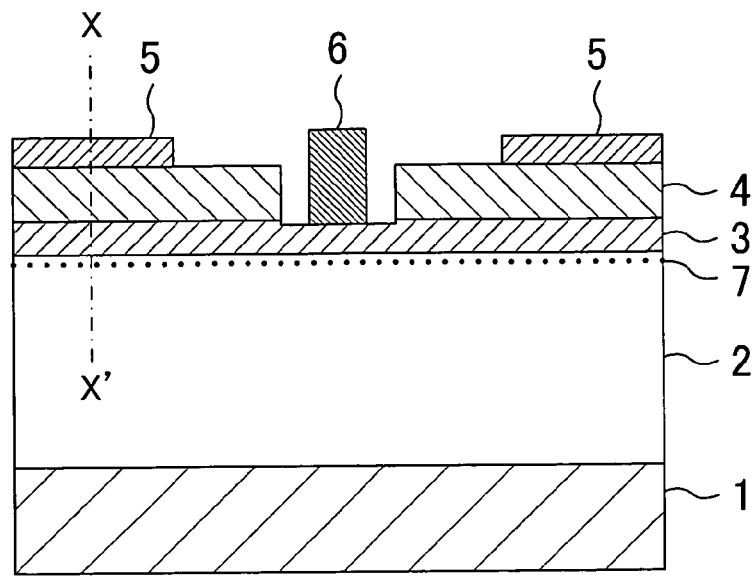
FIG. 1A is a cross-sectional view of a field effect transistor according to Embodiment 1 of the invention.

FIG. 1A is a cross-sectional view of the field effect transistor of Embodiment 1.

As shown in FIG. 1A, an undoped GaN buffer layer 2 is formed on a sapphire substrate 1 by epitaxial growth. A two-dimensional electron gas 7 is generated in an upper portion of the undoped GaN buffer layer 2, so that the upper portion of the undoped GaN buffer layer 2 can function as a channel layer of the field effect transistor. An n-type AlGaN electron supply layer 3 and an n-type InAlGaN cap layer 4 are successively formed on the undoped GaN buffer layer 2 by the epitaxial growth. A recess reaching the n-type AlGaN electron supply layer 3 is formed in a given portion of the n-type InAlGaN cap layer 4, and a Pd—Si (i.e., an alloy of Pd and Si) Schottky electrode 6 working as a gate electrode is formed on the n-type AlGaN electron supply layer 3 exposed in the recess. Also, Ti/Al (i.e., multilayered Ti and Al) ohmic electrodes 5 working as a source electrode and a drain electrode are formed on the n-type InAlGaN cap layer 4 on the respectively sides of the Schottky electrode 6.

The undoped GaN buffer layer 2 has a thickness of, for example, 2500 nm, the n-type AlGaN electron supply layer 3 has a thickness of, for example, 25 nm, and the n-type InAlGaN cap layer 4 has a thickness of, for example, 50 nm. Also, the impurity concentration in the n-type AlGaN electron supply layer 3 is, for example, approximately $4.0\times10^{18}$ atoms/$cm^3$, and the impurity concentration in the n-type InAlGaN cap layer 4 is, for example, approximately $1.0\times10^{19}$ atoms/$cm^3$.

Figure 1B:
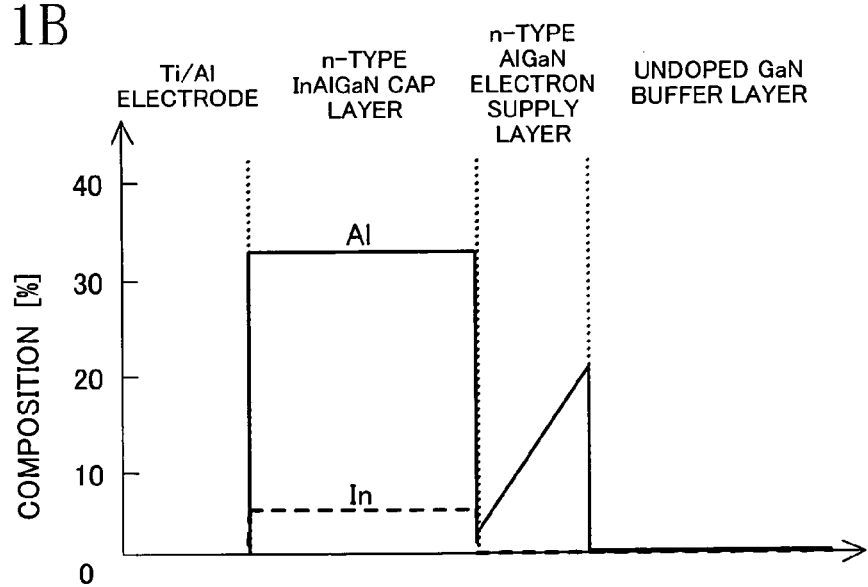
FIG. 1B is a diagram for showing change of Al composition and In composition along line X-X' of FIG. 1A
Figure 1C:
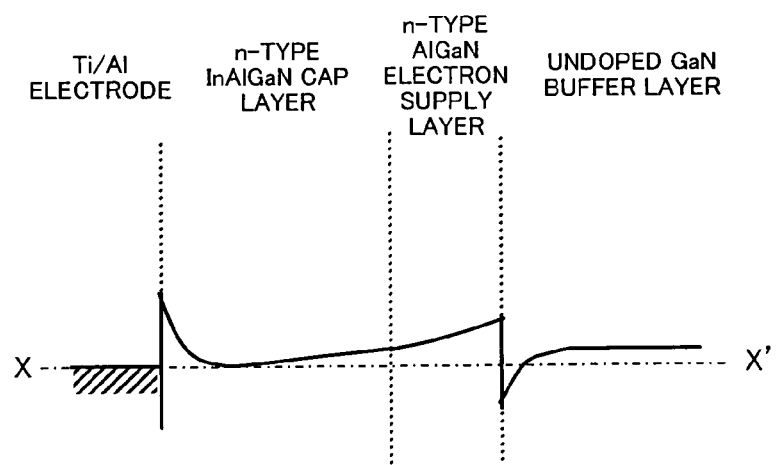
FIG. 1C is a diagram for showing change of electron potential energy along line X-X' of FIG. 1A.

FIG. 1B is a diagram for showing change of Al composition and In composition along line X-X' of FIG. 1A and FIG. 1C is a diagram for showing change of electron potential energy along line X-X' of FIG. 1A. As shown in FIG. 1B, the Al composition in the n-type AlGaN electron supply layer 3 is changed along the thickness direction as a characteristic of this embodiment. Specifically, the Al composition in the n-type AlGaN electron supply layer 3 is changed to be larger as a distance from the interface between the n-type AlGaN electron supply layer 3 and the n-type InAlGaN cap layer 4 is larger, so that the n-type AlGaN electron supply layer 3 and the n-type InAlGaN cap layer 4 can attain a substantially equal energy gap Eg on the interface therebetween, in other words, so that the lower ends of the conduction bands of these layers can be substantially continuous on the interface therebetween. As a result, the InAlGaN/AlGaN interface can be completely free from a potential barrier as shown in FIG. 1C.

In this embodiment, in the case where the n-type InAlGaN cap layer 4 is made of, for example, $In_{0.09}Al_{0.42}Ga_{0.59}N$ (with a band gap Eg of 3.68 eV and a thickness of 50 nm), the n-type AlGaN electron supply layer 3 is made of AlGaN (with a thickness of 25 nm) in which the composition is changed from $Al_{0.15}Ga_{0.85}N$ (with a band gap Eg of 3.68 eV) to $Al_{0.25}Ga_{0.75}N$ (with a band gap Eg of 3.91 eV) along a direction from the n-type InAlGaN cap layer 4 toward the undoped GaN buffer layer 2. Thus, the aforementioned effect can be attained.

Alternatively, in this embodiment, in the case where the n-type InAlGaN cap layer 4 is made of, for example, $In_{0.10}Al_{0.47}Ga_{0.43}N$ (with a band gap Eg of 3.81 eV and a thickness of 50 nm), the n-type AlGaN electron supply layer 3 is made of AlGaN (with a thickness of 25 nm) in which the composition is changed from $Al_{0.21}Ga_{0.79}N$ (with a band gap Eg of 3.81 eV) to $Al_{0.25}Ga_{0.75}N$ (with a band gap Eg of 3.91 eV) along the direction from the n-type InAlGaN cap layer 4 toward the undoped GaN buffer layer 2. Thus, the aforementioned effect can be attained.

Figure 14:
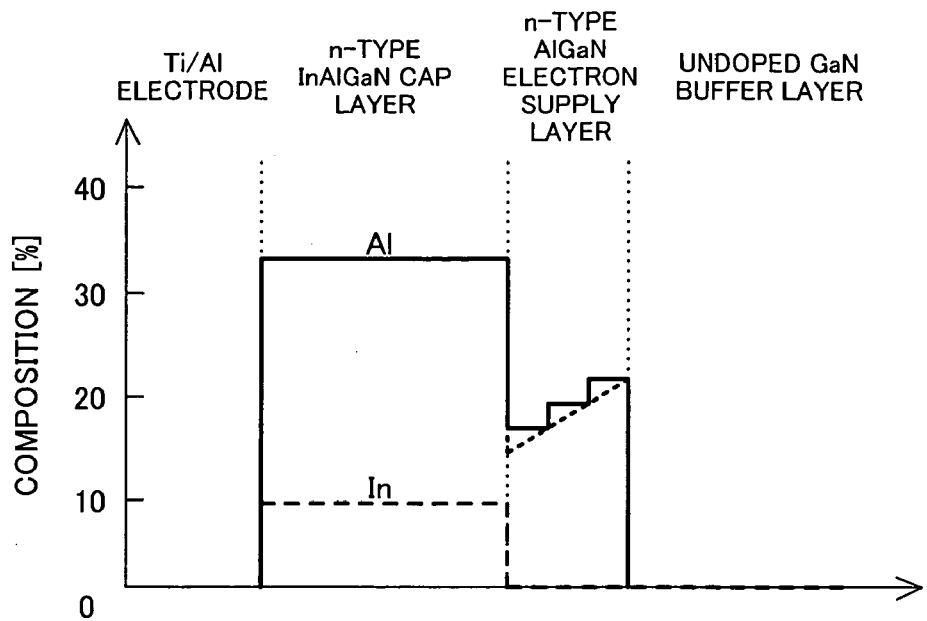
FIG. 14 is a diagram for showing change of Al composition and In composition along line X-X' of FIG. 1A.

Furthermore, in this embodiment, the Al composition in the n-type AlGaN electron supply layer 3 is linearly increased (as gradient composition) as the distance from the interface with the n-type InAlGaN cap layer 4 is larger as shown in FIG. 1B. Instead, the Al composition may be increased in a stepwise manner (as stepwise composition) as the distance from the interface is larger, for example, as shown in FIG. 14. Thus, the average Al composition in the n-type AlGaN electron supply layer 3 can be increased as compared with the case employing the gradient composition, and therefore, the concentration of generated carriers is increased, so as to reduce parasitic resistance. Also, the influence of discontinuity of the conduction bands caused in employing the stepwise composition can be reduced by reducing discontinuity between respective steps. Specifically, in the case where the n-type InAlGaN cap layer 4 is made of, for example, $In_{0.09}Al_{0.42}Ga_{0.59}N$ (with a-band gap Eg of 3.68 eV and a thickness of 50 mn), the n-type AlGaN electron supply layer 3 is made of AlGaN with stepwise composition (with a thickness of 25 nm in total) composed of a first layer of $Al_{0.18}Ga_{0.82}N$ (with a band gap Eg of 3.75 eV and a thickness of 8 nm), a second layer of $Al_{0.22}Ga_{0.78}N$ (with a band gap Eg of 3.83 eV and a thickness of 8 nm) and a third layer of $Al_{0.25}Ga_{0.75}N$ (with a band gap Eg of 3.91 eV and a thickness of 9 nm). Thus, the aforementioned effect can be attained. Alternatively, in the case where the n-type InAlGaN cap layer 4 is made of, for example, $In_{0.10}Al_{0.47}Ga_{0.43}N$ (with a band gap Eg of 3.81 eV and a thickness of 50 nm), the n-type AlGaN electron supply layer 3 is made of AlGaN with stepwise composition (with a thickness of 25 nm in total) composed of a first layer of $Al_{0.22}Ga_{0.78}N$ (with a band gap Eg of 3.83 eV and a thickness of 5 mn), a second layer of $Al_{0.24}Ga_{0.76}N$ (with a band gap Eg of 3.86 eV and a thickness of 5 nm) and a third layer of $Al_{0.25}Ga_{0.75}N$ (with a band gap Eg of 3.91 eV and a thickness of 15 nm). Thus, the aforementioned effect can be attained. It is noted that the aforementioned values of the energy gaps of the InAlGaN are calculated with a bowing parameter set to 2.6 and that the aforementioned values of the energy gaps of the AlGaN are calculated with a bowing parameter set to 1.0.

Figure 15:
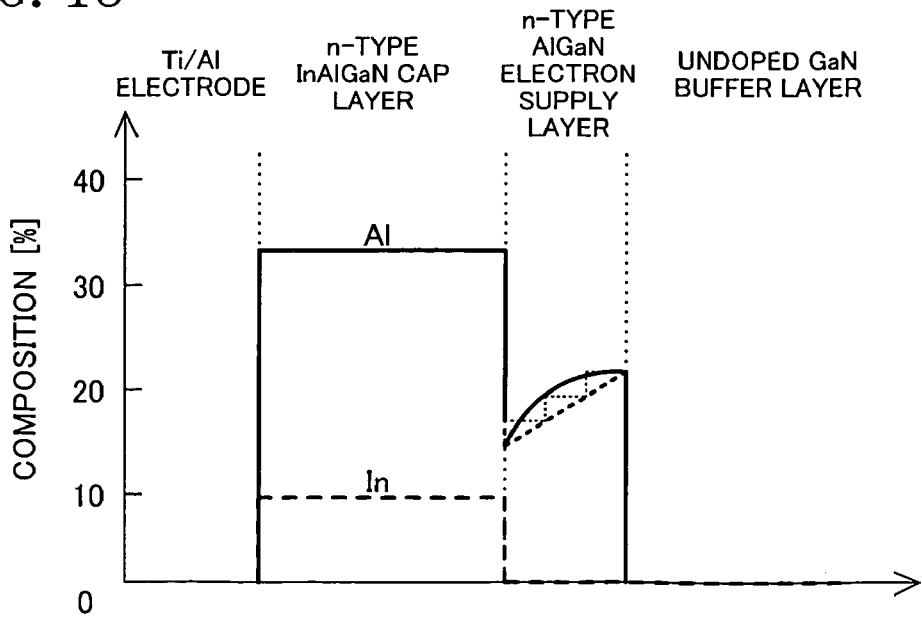
FIG. 15 is a diagram for showing modification of the change of the Al composition and the In composition along line X-X' of FIG. 1A.

Alternatively, in this embodiment, the Al composition in the n-type AlGaN electron supply layer 3 may be increased in the shape of a quadratic curve upward convex (as quadratic functional composition) as the distance from the interface with the n-type InAlGaN cap layer 4 is larger, for example, as shown in FIG. 15. Thus, the average Al composition in the n-type AlGaN electron supply layer 3 can be increased as compared with the case employing the gradient composition, and therefore, the concentration of generated carriers is increased so as to reduce the parasitic resistance. Furthermore, as compared with the case employing the stepwise composition, although the conduction bands are inclined in a direction for disturbing movement of electrons in the n-type AlGaN electron supply layer 3, the discontinuity in the conduction bands caused in employing the stepwise composition can be avoided, and therefore, the influence derived from the discontinuity can be suppressed.

Now, conditions required of the composition of the InAlGaN layer used as the cap layer 4 will be described.

First, in order to form the InAlGaN layer in a large thickness, namely, in order to reduce the parasitic resistance by reducing the resistance of the InAlGaN layer, it is necessary to attain lattice matching between the InAlGaN layer used as the cap layer 4 and the GaN layer used as the buffer layer 2. In general, the lattice constant of the electron supply layer (AlGaN layer) 3 and the lattice constant of the underlying buffer layer 2 are set to be equivalent. The conditions for attaining the lattice matching between the InAlGaN layer and the GaN layer are as follows: The lattice constant $a_{InAlGaN}$ of the InAlGaN layer is represented by the following formula 4:

$$a_{InAlGaN} = \text{In composition} \times a_{InN} + \text{Al composition} \times a_{AlN} + \text{Ga composition} \times a_{GaN} \quad \text{Formula 4:}$$

wherein $a_{InN}$, $a_{AlN}$ and $a_{GaN}$ are lattice constants of InN, AlN and GaN, respectively. On the basis of a condition for making the lattice constant $a_{InAlGaN}$ of the InAlGaN equal to the lattice constant of the GaN, the following formula 5 is drawn:

$$\text{Al composition} = 4.66 \times \text{In composition} \quad \text{Formula 5:}$$

Figure 2:
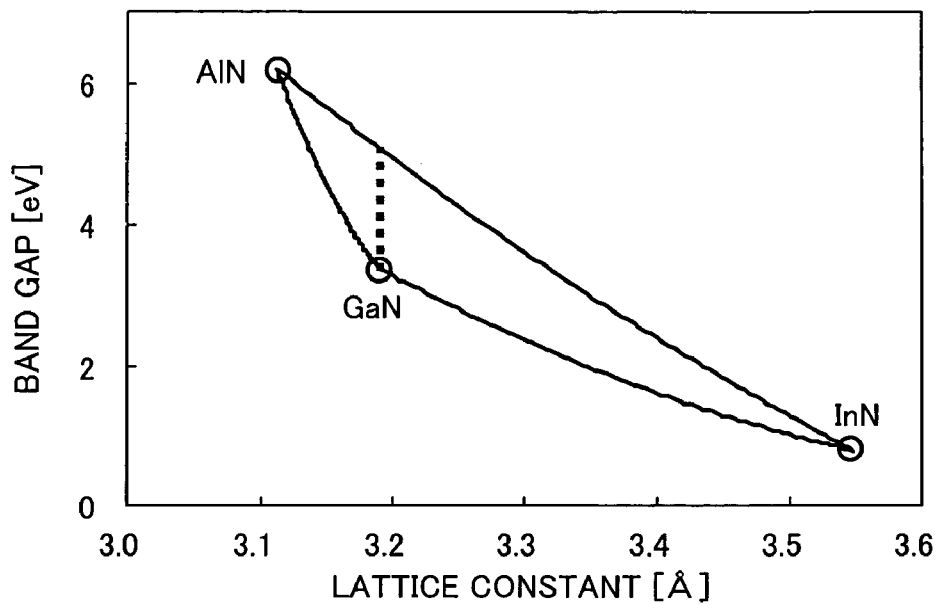
FIG. 2 is a graph for showing the relationship between a band gap and a lattice constant of a group III-V nitride compound semiconductor.

Specifically, the Al composition and the In composition in the InAlGaN layer used as the cap layer 4 preferably satisfy the relationship of Formula 5. Thus, the energy gap of the InAlGaN layer can be freely changed in a region shown with a broken line in FIG. 2. FIG. 2 shows the relationship between the energy gap and the lattice constant of a group III-V nitride compound semiconductor.

Figure 3:
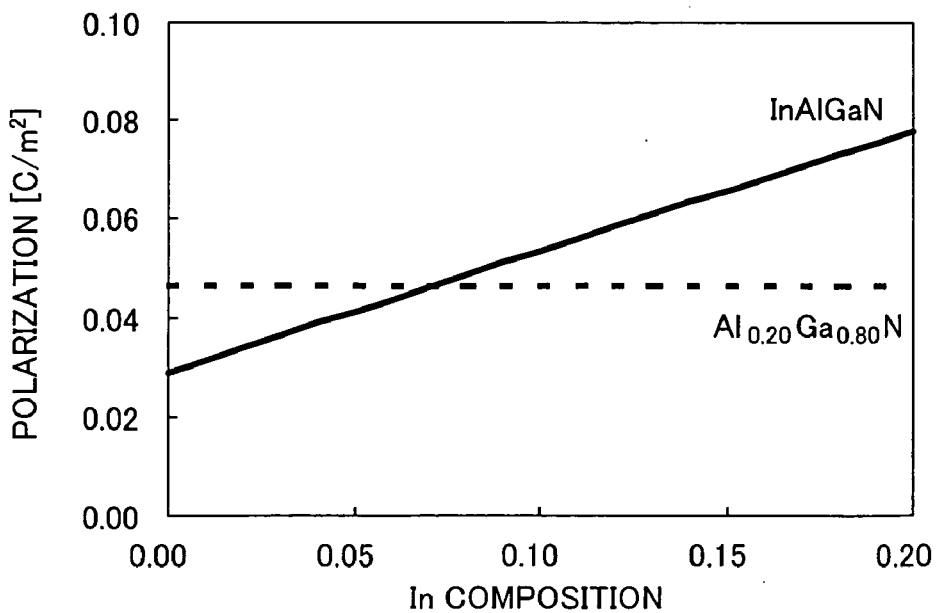
FIG. 3 is a graph for showing dependency on In composition of polarization caused in an InAlGaN layer.

Next, in order to further suppress the increase of a potential barrier on the interface between the n-type AlGaN electron supply layer 3 and the n-type InAlGaN cap layer 4 by suppressing generation of a depletion layer on this interface and also in order to reduce the parasitic resistance derived from channel resistance by supplying electrons in a high concentration to the channel layer, the InAlGaN layer should have larger polarization than the AlGaN layer used as the electron supply layer 3. For this purpose, the Al composition and the In composition in the InAlGaN layer are required to satisfy the following relationship: Polarization is provided as a sum of spontaneous polarization $P_{sp}$ peculiar to the material and piezoelectric polarization $P_{pe}$ caused through strain of the lattice caused by externally applied force or the like. The spontaneous polarization $P_{sp}$ and the piezoelectric polarization $P_{pe}$ are respectively represented by the following formulas 6 and 7 (see Journal Of Applied Physics, Vol. 87, pp. 334-336):

$$P_{sp} = \text{In composition} \times P_{spInN} + \text{Al composition} \times P_{spAlN} + \text{Ga composition} \times P_{spGaN} \quad \text{Formula 6:}$$

$$P_{pe} = e_{33} \cdot d_z + e_{31} \cdot (d_x + d_y) \quad \text{Formula 7:}$$

wherein $P_{spInN}$, $P_{spAlN}$ and $P_{spGaN}$ are spontaneous polarization of InN, AlN and GaN, respectively, $e_{31}$ and $e_{33}$ are piezoelectric coefficients, $d_x$ and $d_y$ are strain of the lattice along the (0001) plane direction, and $d_z$ is strain of the lattice along a direction vertical to the (0001) plane. The dependency on the In composition of the polarization caused in the InAlGaN layer obtained based on Formulas 6 and 7 is shown in FIG. 3. In this case, the calculation is performed, in consideration of the lattice matching between InAlGaN and GaN, on the assumption that the Al composition is 4.66 times as large as the In composition in accordance with Formula 5. FIG. 3 also shows polarization caused in an AlGaN layer with the Al composition of 20% as an example of the AlGaN layer used as the electron supply layer 3. As shown in FIG. 3, in order to make the polarization caused in the InAlGaN layer used as the cap layer 4 larger than the polarization caused in the AlGaN layer used as the electron supply layer 3, the In composition is set to 8% or more and the Al composition is set to 37% or more, that is, 4.66 times as large as the In composition.

Figure 4:
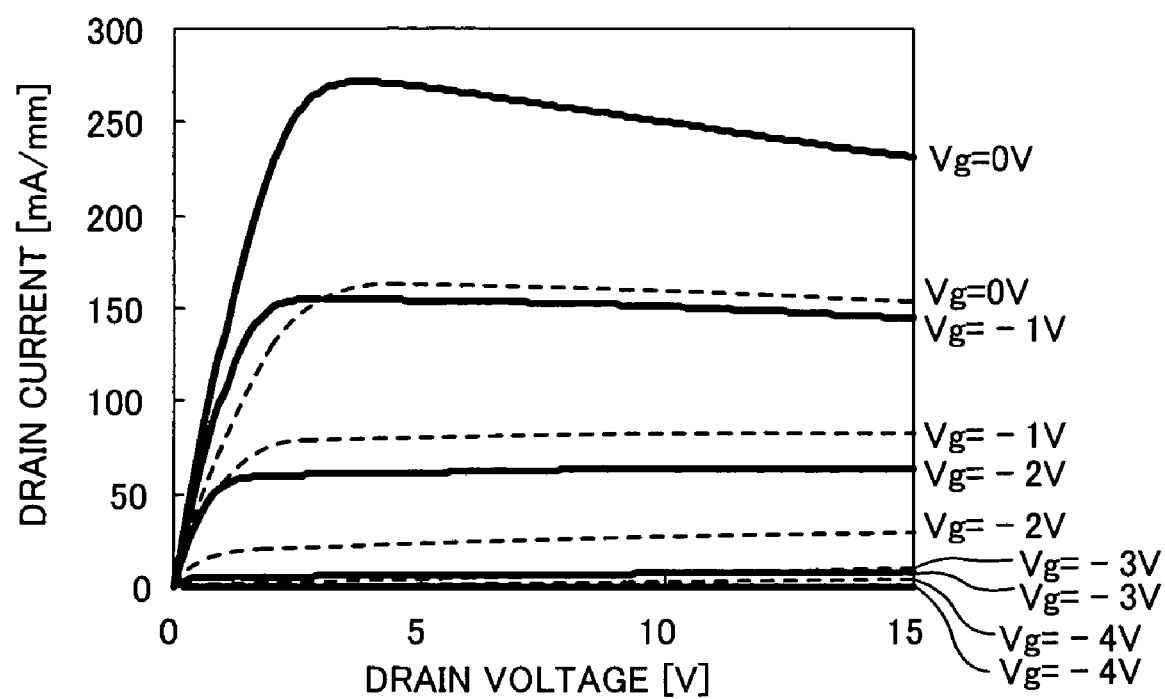
FIG. 4 is a graph for showing current-voltage characteristics of the field effect transistor of Embodiment 1 and a conventional field effect transistor.
Figure 9A:
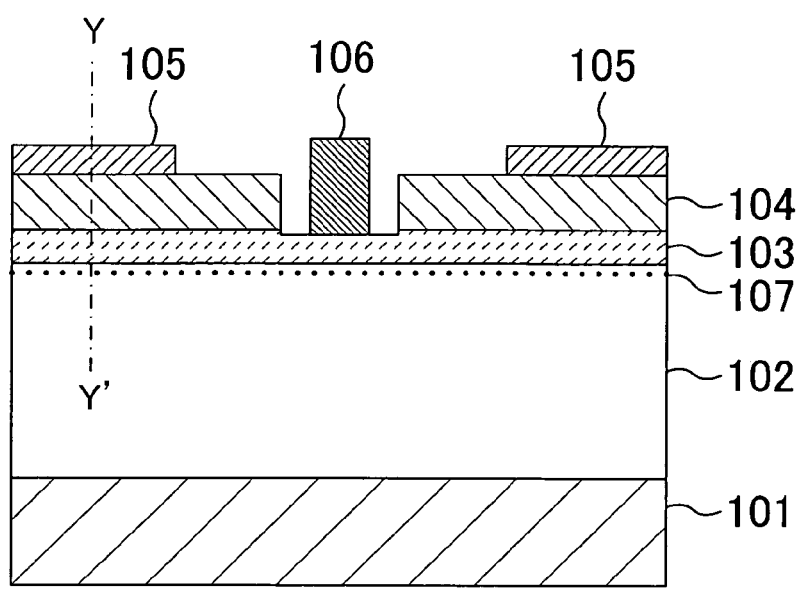
FIG. 9A is a cross-sectional view of a conventional field effect transistor.
Figure 9B:
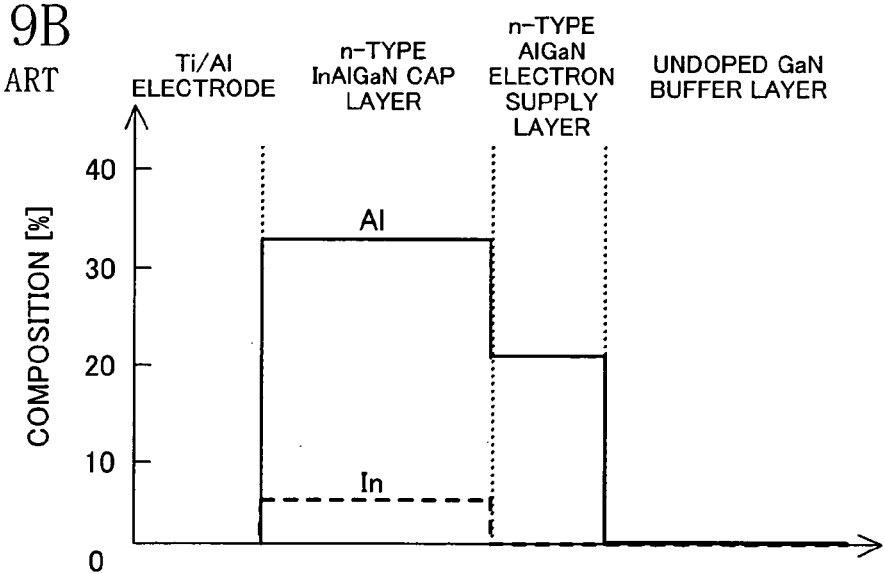
FIG. 9B is a diagram for showing change of Al composition and In composition along line Y-Y' of FIG. 9A
Figure 9C:
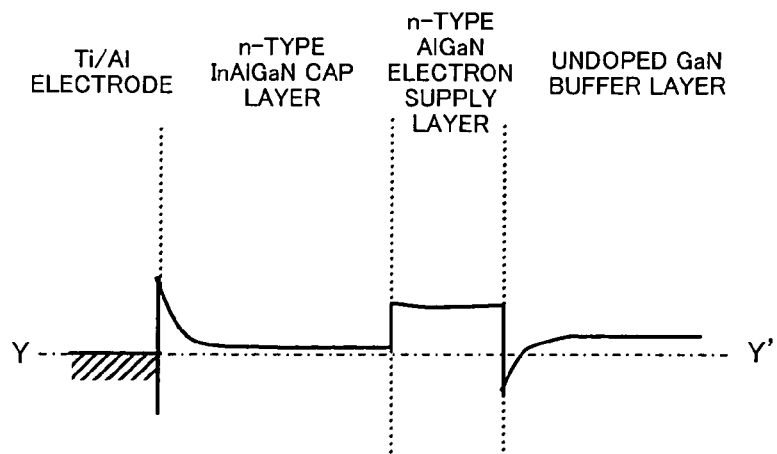
FIG. 9C is a diagram for showing change of electron potential energy along line Y-Y' of FIG. 9A.
Figures 10, 11:
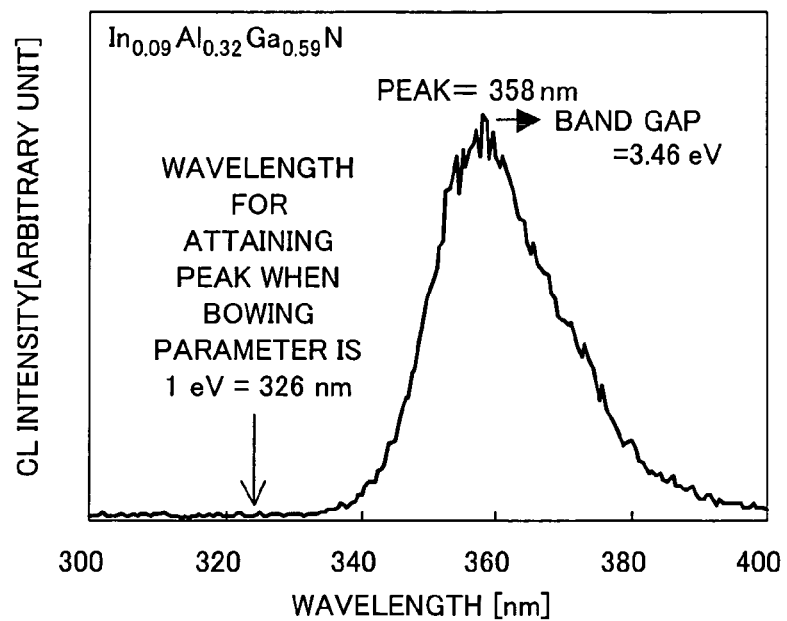
FIG. 10 is a diagram for showing an evaluation result of a band gap of $In_{0.09}Al_{0.32}Ga_{0.59}N$ obtained by the present inventors by a cathode luminescence (CL) method.
FIG. 11 is a table for showing energy gaps Eg and bowing parameters of a plurality of samples of InAlGaN obtained by the present inventors.

FIG. 4 shows the current-voltage characteristics of the field effect transistor of this embodiment (shown with solid lines). In FIG. 4, the ordinate indicates a drain current per unit gate width and the abscissa indicates a drain voltage. For reference, FIG. 4 also shows the current-voltage characteristics of a conventional field effect transistor of FIG. 9A (shown with broken lines). As shown in FIG. 4, in the field effect transistor of this embodiment, the rise of the drain current is obviously more abrupt than in the conventional field effect transistor. This is because a potential barrier is not formed on the interface between the cap layer and the electron supply layer in this embodiment while it is formed in the conventional field effect transistor.

As described so far, according to the field effect transistor of this embodiment, the n-type InAlGaN cap layer 4 is stacked on the n-type AlGaN electron supply layer 3 in which the Al composition is changed along the thickness direction. Therefore, the lower ends of the conduction bands of the cap layer 4 and the electron supply layer 3 can be made substantially continuous on the hetero interface between these layers. Accordingly, a potential barrier can be lowered on the hetero interface between the cap layer 4 and the electron supply layer 3, and hence, the increase of the parasitic resistance can be suppressed, so that the device characteristics such as the high-frequency characteristics can be largely improved.

Also, in the field effect transistor of this embodiment, the ohmic electrodes 5 (working as the source electrode and the drain electrode) with very low resistance of $3 \times 10^{-6}$ $\Omega \cdot cm^2$ or less can be formed on the n-type InAlGaN cap layer 4.

Figure 12:
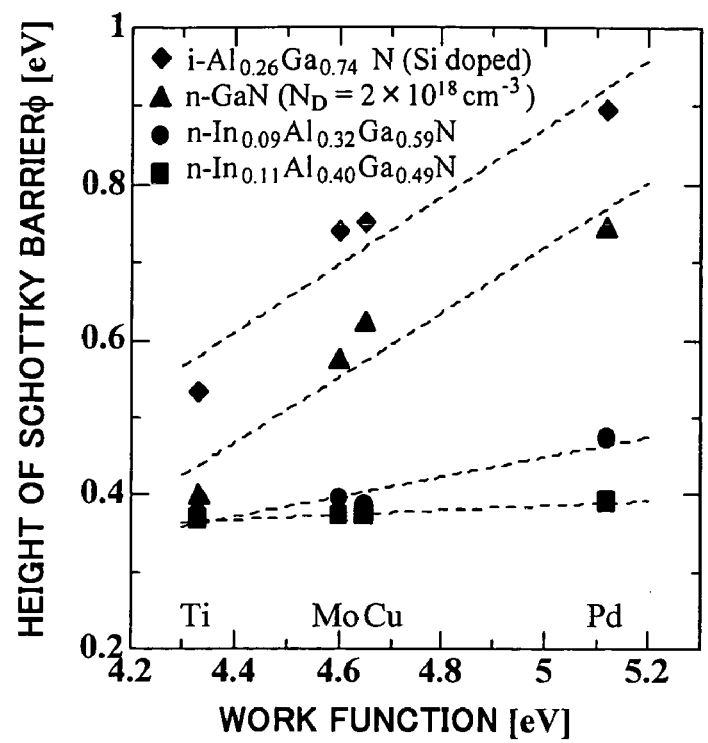
FIG. 12 is a graph for showing the relationship, obtained by the present inventors, between the work functions of a metal against AlGaN, GaN and InAlGaN and the height φ of a Schottky barrier.

FIG. 12 shows the relationship, obtained by the present inventors, between the work functions of metals and the Schottky barrier height $\phi$ of AlGaN, GaN and InAlGaN. As shown in FIG. 12, in the work function against InAlGaN, the height $\phi$ is very small with respect to any metal. This reveals that InAlGaN has large electron affinity, and since the height $\phi$ is small in using any metal, an ohmic electrode can be easily formed on n-type InAlGaN.

Figure 13:
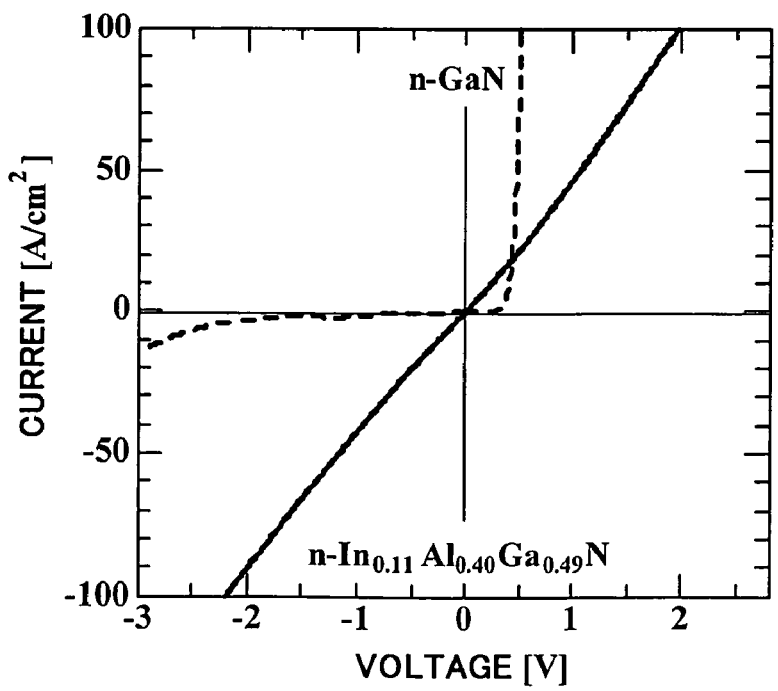
FIG. 13 is a graph for showing current-voltage characteristics, obtained by the present inventors, of GaN and InAlGaN in using Mo for a Schottky electrode.

FIG. 13 shows the current-voltage characteristics, obtained by the present inventors, of GaN and InAlGaN in using Mo (molybdenum) for a Schottky electrode. As shown in FIG. 13, while the current-voltage characteristic of GaN (shown with a broken line) has a rectifying property, the current-voltage characteristic of InAlGaN (shown with a solid line) does not have a rectifying property but a current flows under application of both positive and negative bias voltages. It is understood from these characteristics that an ohmic electrode with very low resistance can be formed on n-type InAlGaN.

Now, the method for fabricating the field effect transistor of this embodiment shown in FIG. 1A will be described.

FIGS. 5A through 5D are cross-sectional views for showing procedures in the method for fabricating the field effect transistor of this embodiment.

Figure 5A:
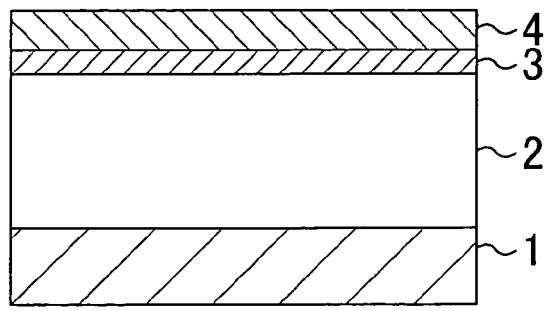
FIGS. 5A, 5B, 5C and 5D are cross-sectional views for showing procedures in a method for fabricating the field effect transistor of Embodiment 1.

First, as shown in FIG. 5A, an undoped GaN buffer layer 2, an n-type AlGaN electron supply layer 3 and an n-type InAlGaN cap layer 4 are successively formed on the (0001) plane of a sapphire substrate 1 by metal organic chemical vapor deposition (MOCVD). It is noted that the n-type AlGaN electron supply layer 3 has a larger energy gap than the undoped GaN buffer layer 2. Also, the n-type AlGaN electron supply layer 3 and the n-type InAlGaN cap layer 4 are doped with Si by using a $SiH_4$ gas. Furthermore, in forming the n-type AlGaN electron supply layer 3, the Al composition is changed along the thickness direction. Specifically, the Al composition in the n-type AlGaN electron supply layer 3 is changed to be larger as a distance from the interface between the n-type AlGaN electron supply layer 3 and the n-type InAlGaN cap layer 4 is larger. In this manner, the energy gap of the n-type AlGaN electron supply layer 3 and the energy gap of the n-type InAlGaN cap layer 4 are made substantially equivalent to each other on the InAlGaN/AlGaN hetero interface.

Figure 5B:
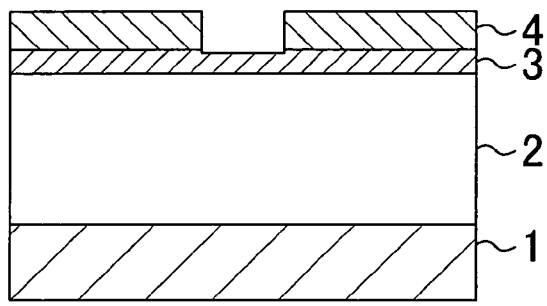

Subsequently, a photoresist (not shown) having a stripe-shaped opening is formed on the n-type InAlGaN cap layer 4. At this point, the width of the stripe is, for example, approximately 5 μm. Next, by using the photoresist as a mask, the n-type InAlGaN cap layer 4 is selectively removed by induced coupled plasma (ICP) etching using, for example, a $Cl_2$ gas, so as to form a recess for exposing the n-type AlGaN electron supply layer 3 therein as shown in FIG. 5B.

Figure 5C:
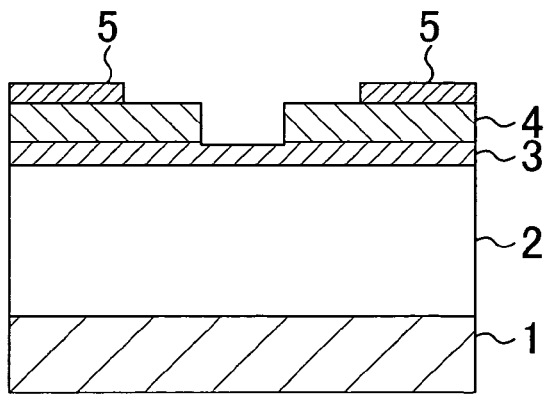

Next, as shown in FIG. 5C, Ti/Al ohmic electrodes 5 working as a source electrode and a drain electrode are formed on the respective sides of the recess on the n-type InAlGaN cap layer 4 by, for example, electron beam evaporation and lift-off. Thereafter, annealing is performed, for example, in a $N_2$ atmosphere at 600° C. for reducing contact resistance. At this point, the temperature for the annealing is preferably lower than the temperature at which the n-type InAlGaN cap layer 4 is formed. Thus, crystallinity degradation of the n-type InAlGaN cap layer 4 otherwise caused in the annealing can be suppressed so as to retain high crystallinity, and hence, the increase of the parasitic resistance can be suppressed.

Figure 5D:
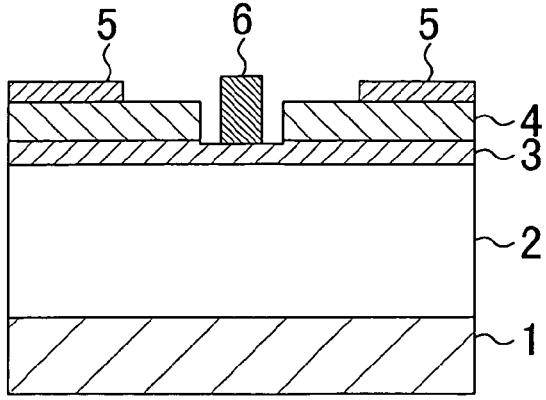

Then, as shown in FIG. 5D, a Pd—Si (i.e., an alloy of Pd and Si) Schottky electrode 6 working as a gate electrode is formed on the n-type AlGaN electrons supply layer 3 exposed within the recess by, for example, the electron beam evaporation and the lift-off. In this manner, the field effect transistor of this embodiment shown in FIG. 1A can be completed.

In the aforementioned method for fabricating the field effect transistor of this embodiment, since the field effect transistor of this embodiment shown in FIG. 1A can be obtained, the potential barrier formed on the hetero interface between the cap layer 4 and the electron supply layer 3 can be lowered. As a result, the increase of the parasitic resistance can be suppressed, so as to largely improve the device characteristics such as the high-frequency characteristics.

In the method for fabricating the field effect transistor of this embodiment, in adding an impurity to the n-type InAlGaN cap layer 4 for providing an n-type conductivity type after forming the n-type InAlGaN cap layer 4, the impurity concentration is preferably higher in the uppermost portion of the n-type InAlGaN cap layer 4 than in other portions. Also, after adding the impurity, annealing is performed preferably at a temperature lower than the temperature at which the n-type InAlGaN cap layer 4 is formed. Thus, the impurity concentration in the n-type InAlGaN cap layer 4 can be increased, and therefore, contact resistance between the Ti/Al ohmic electrodes 5 and the n-type InAlGaN cap layer 4 can be reduced and the resistance of the n-type InAlGaN cap layer 4 can be reduced. Furthermore, the crystallinity degradation of the n-type InAlGaN cap layer 4 otherwise caused in the annealing can be suppressed so as to retain high crystallinity, and therefore, the parasitic resistance can be reduced.

Modification of Embodiment 1

A method for fabricating a field effect transistor according to a modification of Embodiment 1 of the invention will now be described with reference to the accompanying drawings. In the fabrication method of this modification, the field effect transistor of Embodiment 1 shown in FIG. 1A is fabricated.

FIGS. 6A through 6F are cross-sectional views for showing procedures in the method for fabricating the field effect transistor of this modification. Although the recess corresponding to a gate electrode forming region is formed by etching the n-type InAlGaN cap layer 4 in the procedure shown in FIG. 5B in Embodiment 1, the recess is formed by regrowing the n-type InAlGaN cap layer 4 after masking a gate electrode forming region on the n-type AlGaN electron supply layer 3 as described below in this modification.

Figure 6A:
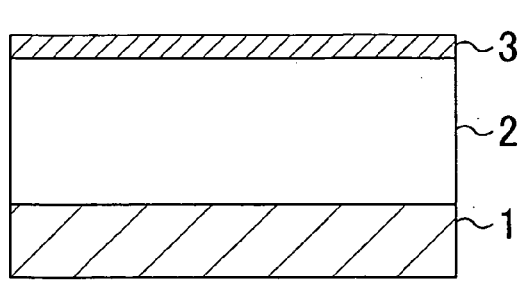
FIGS. 6A, 6B, 6C, 6D, 6E and 6F are cross-sectional views for showing procedures in a method for fabricating a field effect transistor according to a modification of Embodiment 1.

First, as shown in FIG. 6A, an undoped GaN buffer layer 2 and an n-type AlGaN electron supply layer 3 are successively formed on the (0001) plane of a sapphire substrate 1 by the MOCVD. It is noted that the energy gap of the n-type AlGaN electron supply layer 3 is larger than the energy gap of the undoped GaN buffer layer 2. Also, the n-type AlGaN electron supply layer 3 is doped with Si by using a $SiH_4$ gas. Furthermore, in forming the n-type AlGaN electron supply layer 3, the Al composition is changed along the thickness direction. Specifically, the Al composition in the n-type AlGaN electron supply layer 3 is changed to be larger as a distance from the interface between the n-type AlGaN electron supply layer 3 and an n-type InAlGaN cap layer 4 (see FIG. 6C) is larger. In this manner, the energy gap of the n-type AlGaN electron supply layer 3 and the energy gap of the n-type InAlGaN cap layer 4 are made substantially equivalent to each other on the InAlGaN/AlGaN hetero interface. In other words, the lower ends of the conduction bands of the n-type AlGaN electron supply layer 3 and the n-type InAlGaN cap layer 4 are made substantially continuous on the InAlGaN/AlGaN hetero interface.

Figure 6D:
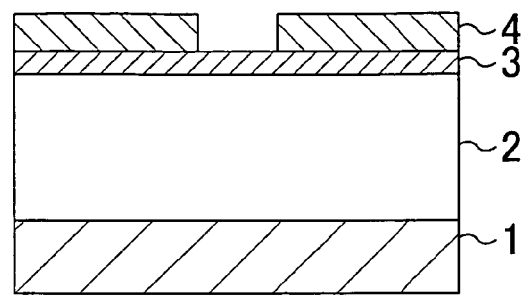
Figure 6B:
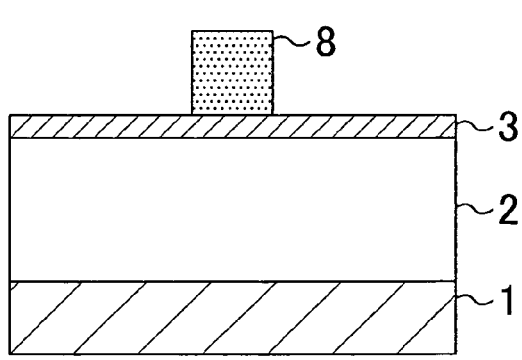

Next, a $SiO_2$ film with a thickness of approximately 100 nm is formed on the n-type AlGaN electron supply layer 3 by vapor phase deposition using, for example, a $SiH_4$ gas and an $O_2$ gas, such as CVD (chemical vapor deposition). Subsequently, in order to pattern the $SiO_2$ film into stripes with a width of, for example, 5 μm, the $SiO_2$ film is selectively etched with a hydrofluoric acid (HF) aqueous solution by using, for example, a photoresist as a mask. Thus, a $SiO_2$ mask 8 is formed as shown in FIG. 6B.

At this point, the thickness of the $SiO_2$ film used as the $SiO_2$ mask 8 is preferably larger than the thickness of the n-type InAlGaN cap layer 4 subsequently formed. Thus, the n-type InAlGaN cap layer 4 can be prevented from being formed on the $SiO_2$ mask 8, and hence, the dimension of a recess formed by removing the $SiO_2$ mask 8 in a subsequent procedure can be accurately controlled. Accordingly, a fine gate electrode can be formed, and hence, the channel length can be reduced, so that parasitic resistance derived from channel resistance can be reduced.

Figure 6E:
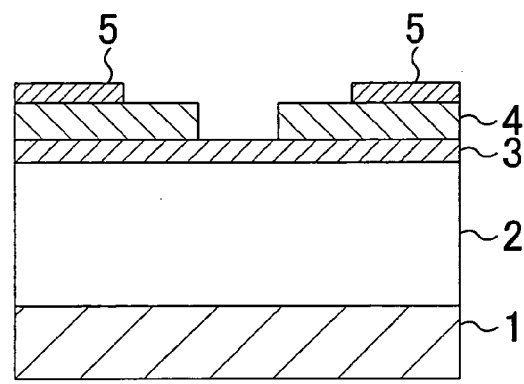
Figure 6C:
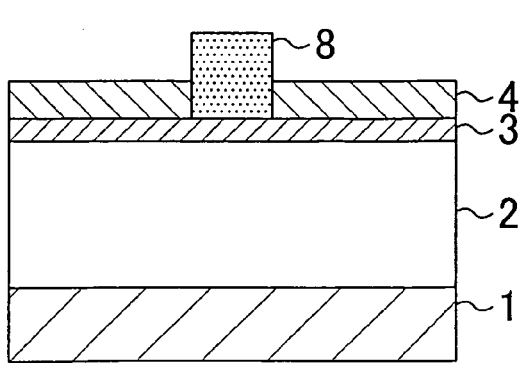

Next, as shown in FIG. 6C, an InAlGaN layer is started to grow by, for example, the MOCVD from a portion of the n-type AlGaN electron supply layer 3 not covered with the $SiO_2$ mask 8, thereby forming the n-type InAlGaN cap layer 4. It is noted that the thickness of the n-type InAlGaN cap layer 4 is smaller than the thickness of the n-type AlGaN electron supply layer 3. Subsequently, as shown in FIG. 6D, the $SiO_2$ mask 8 is removed by using, for example, a hydrofluoric acid (HF) aqueous solution, thereby forming a recess reaching the n-type AlGaN electron supply layer 3.

Then, in the same manner as in the procedure of FIG. 5C of Embodiment 1, Ti/Al ohmic electrodes 5 working as a source electrode and a drain electrode are formed on the respective sides of the recess on the n-type InAlGaN cap layer 4 by, for example, the electron beam evaporation and the lift-off as shown in FIG. 6E. Thereafter, annealing is performed, for example, in a $N_2$ atmosphere at 600° C. for reducing contact resistance. At this point, the temperature for the annealing is preferably lower than the temperature at which the n-type InAlGaN cap layer 4 is formed. Thus, the crystallinity degradation of the n-type InAlGaN cap layer 4 otherwise caused in the annealing can be suppressed so as to retain high crystallinity, and hence, the increase of the parasitic resistance can be suppressed.

Figure 6F:
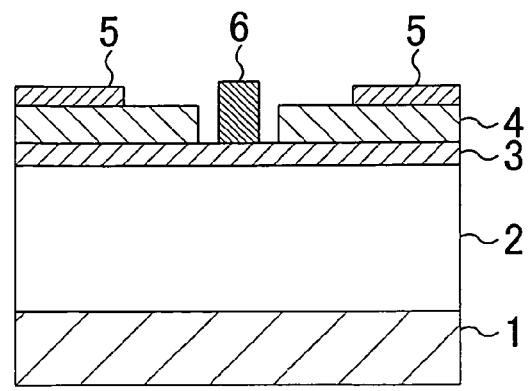

Next, in the same manner as in the procedure of FIG. 5D of Embodiment 1, a Pd—Si (i.e., an alloy of Pd and Si) Schottky electrode 6 working as a gate electrode is formed on the n-type AlGaN electron supply layer 3 within the recess by, for example, the electron beam evaporation and the lift-off as shown in FIG. 6F. Thus, the field effect transistor of Embodiment 1 shown in FIG. 1A can be completed.

According to this modification, the same effects as those of Embodiment 1 can be attained. Also, since the recess for forming the gate electrode can be formed without damaging a region below the gate electrode working as a channel region by etching, degradation of the transistor characteristics such as the increase of the parasitic resistance derived from the channel resistance can be prevented.

Although $SiO_2$ is used as a material for the mask 8 in this modification, another material with a selection ratio against a group III-V nitride compound semiconductor may be used instead.

Embodiment 2

A field effect transistor and a method for fabricating the same according to Embodiment 2 of the invention will now be described with reference to the accompanying drawings.

Figure 7:
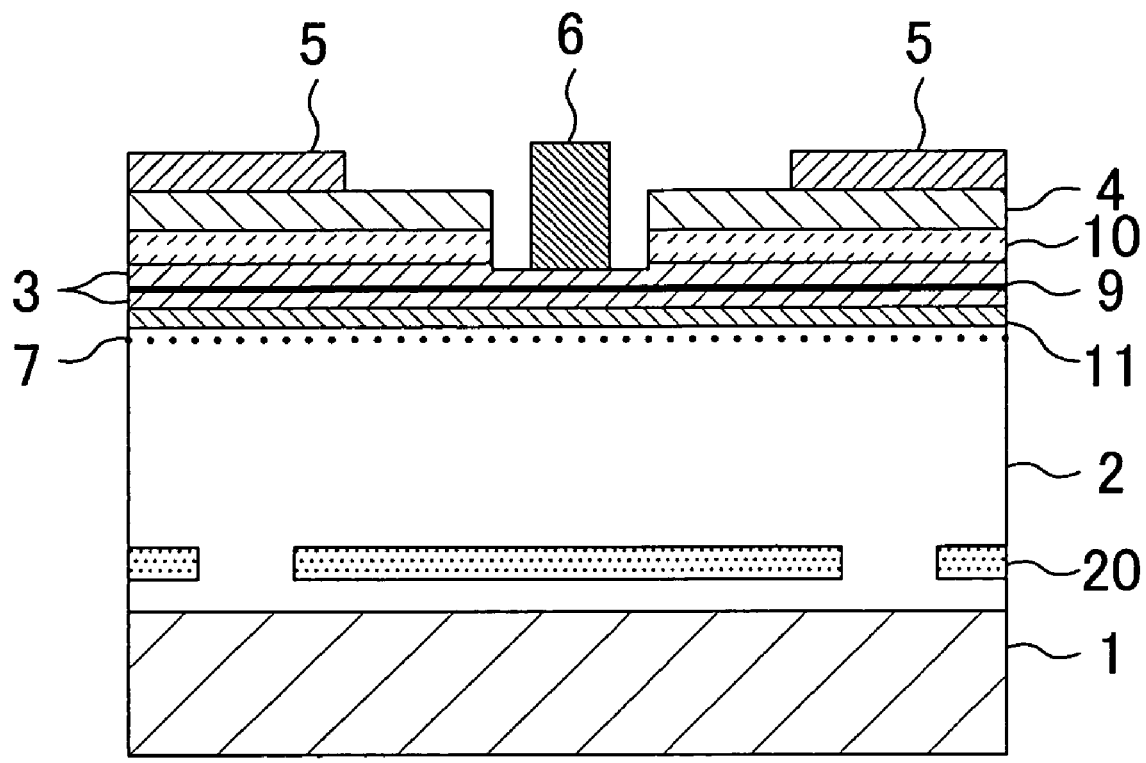
FIG. 7 is a cross-sectional view of a field effect transistor according to Embodiment 2 of the invention.

FIG. 7 is a cross-sectional view of the field effect transistor of this embodiment. In FIG. 7, like reference numerals are used to refer to like elements used in Embodiment 1 shown in FIG. 1A. Embodiment 2 is different from Embodiment 1 in the following points as described below: Directly below an n-type InAlGaN cap layer 4, a multilayered film including at least one cycle of another InAlGaN layer and an AlGaN layer alternately stacked is provided; and an n-type AlGaN electron supply layer 3 (in which the Al composition is changed along the thickness direction as in Embodiment 1) is provided with a delta dope layer (i.e., a region including an impurity for providing the conductivity type to the n-type AlGaN electron supply layer 3 so as to cause a pulse-shaped profile along a direction vertical to the interface between the n-type AlGaN electron supply layer 3 and the n-type InAlGaN cap layer 4).

As shown in FIG. 7, an AlN spacer layer 11 and an n-type AlGaN electron supply layer 3 are formed by the epitaxial growth on an undoped GaN buffer layer 2 formed on a sapphire substrate 1. A two-dimensional electron gas 7 is generated in an upper portion of the undoped GaN buffer layer 2, so that the upper portion of the undoped GaN buffer layer 2 can function as a channel layer of the field effect transistor. Also, a $SiO_2$ mask 20 is provided in a lower portion of the undoped GaN buffer layer 2. A multilayered film 10 including seven cycles each including an n-type InAlGaN thin film with a thickness of, for example, 1.5 nm and an n-type AlGaN thin film with a thickness of, for example, 1.5 nm alternately stacked is formed on the n-type AlGaN electron supply layer 3. An n-type InAlGaN cap layer 4 is formed by the epitaxial growth on the multilayered film 10. A recess reaching the n-type AlGaN electron supply layer 3 is formed in a given portion of the n-type InAlGaN cap layer 4, and a Pd—Si (i.e., an alloy of Pd and Si) Schottky electrode 6 working as a gate electrode is formed on the n-type AlGaN electron supply layer 3 exposed within the recess. Also, Ti/Al (i.e., multilayered Ti and Al) ohmic electrodes 5 working as a source electrode and a drain electrode are formed on the respective sides of the Schottky electrode 6 on the n-type InAlGaN cap layer 4.

Also in this embodiment, the Al composition in the n-type AlGaN electron supply layer 3 is changed along the thickness direction. Specifically, the Al composition in the n-type AlGaN electron supply layer 3 is changed to be larger as a distance from the interface between the n-type AlGaN electron supply layer 3 and the n-type InAlGaN cap layer 4 is larger, so that the n-type AlGaN electron supply layer 3 and the n-type InAlGaN cap layer 4 can attain a substantially equal energy gap Eg on the interface therebetween (in which the multilayered film 10 is provided in this embodiment), in other words, so that the lower ends of the conduction bands of these layers can be substantially continuous on the interface (see FIG. 1B). Thus, the InAlGaN/AlGaN interface can be completely free from a potential barrier (see FIG. 1C).

Also, a delta dope layer 9 is formed in the vicinity of the multilayered film 10 in the n-type AlGaN electron supply layer 3. The impurity concentration in the delta dope layer 9 is approximately $1 \times 10^{19}$ atoms/cm$^3$ or more.

Furthermore, the undoped GaN buffer layer 2 has a thickness of, for example, 2500 nm, the AlN spacer layer 11 has a thickness of, for example, 1 nm, the n-type AlGaN electron supply layer 3 has a thickness of, for example, 25 nm, the delta dope layer 9 has a thickness of, for example, 5 nm or less, the multilayered film 10 has a thickness of, for example, 21 nm, and the n-type InAlGaN cap layer 4 has a thickness of, for example, 50 nm. Also, the impurity concentration in the n-type AlGaN electron supply layer 3 is, for example, approximately $4.0 \times 10^{18}$ atoms/cm$^3$, the impurity concentration in the delta dope layer 9 is, for example, $1 \times 10^{19}$ atoms/cm$^3$ or more, the impurity concentration in the multilayered film 10 as a whole is, for example, approximately $1.0 \times 10^{19}$ atoms/cm$^3$, and the impurity concentration in the n-type InAlGaN cap layer 4 is, for example, approximately $1.0 \times 10^{19}$ atoms/cm$^3$.

In the field effect transistor of this embodiment, the Al composition in the n-type AlGaN electron supply layer 3 is changed so that the energy gaps Eg of the n-type AlGaN electron supply layer 3 and the n-type InAlGaN cap layer 4 can be substantially equal to each other on the interface between these layers (in which the multilayered film 10 is provided in this embodiment), in other words, so that the lower ends of the conduction bands of these layers can be substantially continuous on the interface. Therefore, a potential barrier formed on the hetero interface between the cap layer 4 and the electron supply layer 3 can be lowered, and hence, the increase of the parasitic resistance can be suppressed, so that the device characteristics such as the high-frequency characteristics can be largely improved.

Furthermore, in the field effect transistor of this embodiment, the delta dope layer 9 is provided in the n-type AlGaN electron supply layer 3. Since the thus added impurity lowers the conduction band of the n-type AlGaN electron supply layer 3, electrons can easily pass through the potential barrier. In other words, the influence of the potential barrier can be cancelled, so as to further suppress the increase of the parasitic resistance.

Moreover, in the field effect transistor of this embodiment, the multilayered film 10 including at least one cycle of the InAlGaN layer and the AlGaN layer alternately stacked is provided between the n-type AlGaN electron supply layer 3 and the n-type InAlGaN cap layer 4. Therefore, the influence of the potential barrier formed between the n-type AlGaN electron supply layer 3 and the n-type InAlGaN cap layer 4 can be suppressed, so as to suppress the increase of the parasitic resistance derived from the potential barrier, and at the same time, parasitic resistance along a horizontal direction (i.e., a direction parallel to the interface between the n-type AlGaN electron supply layer 3 and the n-type InAlGaN cap layer 4) can be largely reduced.

Also, in the field effect transistor of this embodiment, since the AlN spacer layer 11 is provided between the undoped GaN buffer layer 2 and the n-type AlGaN electron supply layer 3, scattering of alloy can be suppressed, so as to improve the mobility of electrons in the channel, and therefore, the parasitic resistance derived from channel resistance can be reduced.

As described so far, the field effect transistor of this embodiment includes the n-type InAlGaN cap layer 4 directly under which the multilayered film 10 including at least one cycle of the InAlGaN layer and the AlGaN layer alternately stacked is formed and the n-type AlGaN electron supply layer 3 in which the delta dope layer is provided and the Al composition is changed along the thickness direction. Therefore, the increase of the parasitic resistance on the hetero interface between the cap layer 4 and the electron supply layer 3 can be suppressed, so as to largely improve the device characteristics such as the high-frequency characteristics.

Now, the method for fabricating the field effect transistor of this embodiment shown in FIG. 7 will be described.

FIGS. 8A through 8F are cross-sectional views for showing procedures in the method for fabricating the field effect transistor of this embodiment.

Figure 8A:
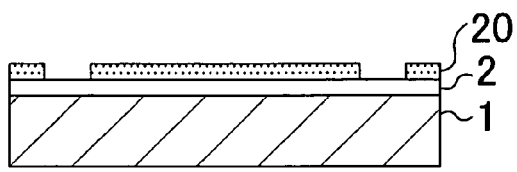
FIGS. 8A, 8B, 8C, 8D, 8E and 8F are cross-sectional views for showing procedures in a method for fabricating a field effect transistor according to a modification of Embodiment 2.

First, as shown in FIG. 8A, an undoped GaN buffer layer 2 is grown halfway on the (0001) plane of a sapphire substrate 1 by the MOCVD. Subsequently, a SiO$_2$ film with a thickness of approximately 100 nm is formed on the undoped GaN buffer layer 2 by the vapor phase deposition using, for example, a SiH$_4$ gas and an O$_2$ gas (such as the CVD). Then, the SiO$_2$ film is selectively etched with a hydrofluoric acid (HF) aqueous solution by using, for example, a photoresist as a mask, so as to form a plurality of SiO$_2$ stripes with a width of 10 μm by forming a plurality of stripe-shaped openings each with a width of, for example, 5 μm in the SiO$_2$ film. Thus, a SiO$_2$ mask 20 is formed.

Figure 8D:
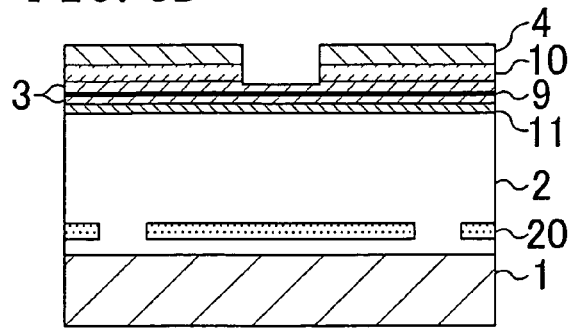
Figure 8B:
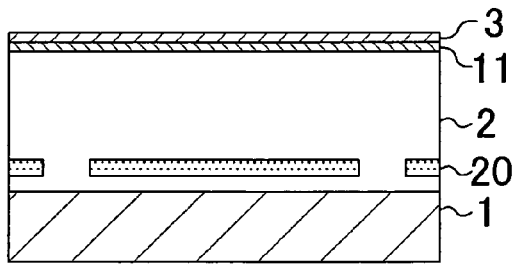

Next, as shown in FIG. 8B, GaN is regrown from the surface of a portion of the undoped GaN buffer layer 2 not covered with the SiO$_2$ mask 20 by, for example, the MOCVD, thereby completing the undoped GaN buffer layer 2 with a desired thickness. In this growth of the GaN by the MOCVD, the crystal of the GaN is grown on the SiO$_2$ mask 20 in the lateral direction, and hence, the threading dislocation density is largely reduced on the SiO$_2$ mask 20, resulting in attaining a dislocation density of the order of $10^6$ cm$^{-2}$. Subsequently, an AlN spacer layer 11 and an n-type AlGaN electron supply layer 3 are successively formed on the undoped GaN buffer layer 2 by, for example, the MOCVD. It is noted that the energy gap of the n-type AlGaN electron supply layer 3 is larger than that of the undoped GaN buffer layer 2. Also, the n-type AlGaN electron supply layer 3 is doped with Si by using a SiH$_4$ gas.

Figure 8E:
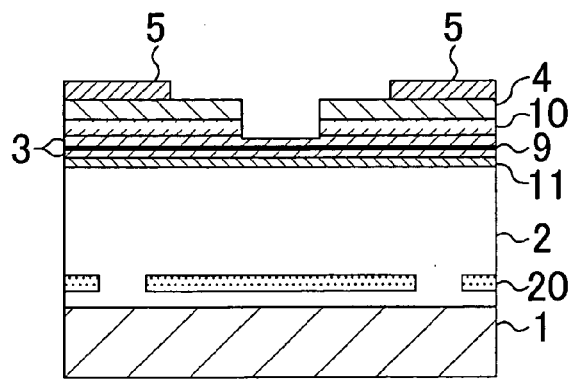
Figure 8C:
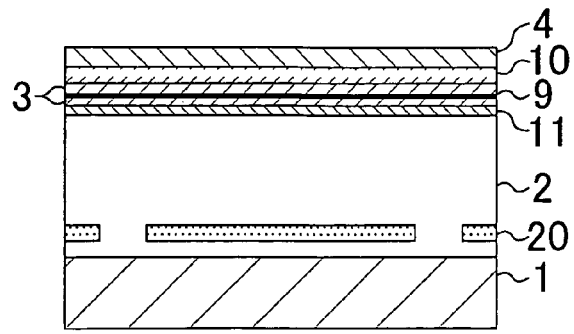

At this point, during the formation of the n-type AlGaN electron supply layer 3, a material gas is once stopped to supply, a SiH$_4$ gas alone is allowed to flow for forming a delta dope layer 9 as shown in FIG. 8C, and thereafter, the supply of the material gas is resumed so as to resume the formation of the n-type AlGaN electron supply layer 3. In the formation of the n-type AlGaN electron supply layer 3, the Al composition is changed along the thickness direction. Specifically, the Al composition in the n-type AlGaN electron supply layer 3 is changed to be larger as a distance from the interface between the n-type AlGaN electron supply layer 3 and an n-type InAlGaN cap layer 4 described below is larger. Thus, the energy gap of the n-type AlGaN electron supply layer 3 and the energy gap of the n-type InAlGaN cap layer 4 are set to be substantially equivalent to each other on the InAlGaN/AlGaN hetero interface.

Next, as shown in FIG. 8C, a multilayered film 10 including at least one cycle of an n-type InAlGaN thin film with a thickness of, for example, 1.5 nm and an n-type AlGaN thin film with a thickness of, for example, 1.5 nm alternately stacked is formed on the n-type AlGaN electron supply layer 3 by the epitaxial growth, and the n-type InAlGaN cap layer 4 is formed on the multilayered film 10. It is noted that the n-type InAlGaN cap layer 4 is doped with Si by using a SiH$_4$ gas.

Subsequently, a photoresist (not shown) having a stripe-shaped opening is formed on the n-type InAlGaN cap layer 4. The width of the stripe is, for example, approximately 5 μm. Then, by using the photoresist as a mask, the n-type InAlGaN cap layer 4 is selectively removed as shown in FIG. 8D by the ICP etching using, for example, a Cl$_2$ gas, thereby forming a recess for exposing the n-type AlGaN electron supply layer 3 therein. At this point, the recess is formed so that a portion of the n-type AlGaN electron supply layer 3 deeper than the delta dope layer 9 can be exposed.

Next, as shown in FIG. 8E, Ti/Al ohmic electrodes 5 working as a source electrode and a drain electrode are formed on the n-type InAlGaN cap layer 4 on the respective sides of the recess by, for example, the electron beam evaporation and the lift-off. Thereafter, annealing is performed, for example, in a N$_2$ atmosphere at 600° C. for reducing contact resistance. At this point, the temperature for the annealing is preferably lower than a temperature at which the n-type InAlGaN cap layer 4 is formed. Thus, the crystallinity degradation of the n-type InAlGaN cap layer 4 otherwise caused in the annealing can be suppressed so as to retain high crystallinity, and hence, the increase of the parasitic resistance can be suppressed.

Figure 8F:
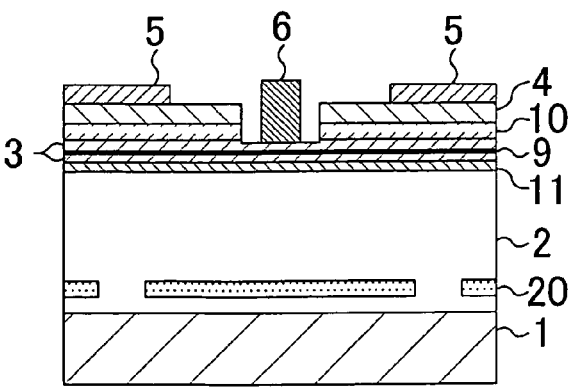

Then, as shown in FIG. 8F, a Pd—Si (i.e., an alloy of Pd and Si) Schottky electrode 6 working as a gate electrode is formed on the n-type AlGaN electron supply layer 3 exposed within the recess by, for example, the electron beam evaporation and the lift-off. In this manner, the field effect transistor of this embodiment shown in FIG. 7 can be completed.

In the aforementioned method for fabricating the field effect transistor of this embodiment, the field effect transistor of this embodiment shown in FIG. 7 can be obtained. Therefore, a potential barrier formed on the hetero interface between the cap layer 4 and the electron supply layer 3 can be lowered, so as to suppress the increase of the parasitic resistance, resulting in largely improving the device characteristics such as the high-frequency characteristics.

In the method for fabricating the field effect transistor of this embodiment, in adding an impurity to the n-type InAlGaN cap layer 4 for providing an n-type conductivity type after forming the n-type InAlGaN cap layer 4, the impurity concentration in the uppermost portion of the n-type InAlGaN cap layer 4 is preferably higher than in other portions. Also, after adding the impurity, annealing is performed preferably at a temperature lower than the temperature at which the n-type InAlGaN cap layer 4 is formed. Thus, the impurity concentration in the n-type InAlGaN cap layer 4 can be increased, and therefore, the contact resistance between the Ti/Al ohmic electrodes 5 and the n-type InAlGaN cap layer 4 can be reduced and the resistance of the n-type InAlGaN cap layer 4 can be reduced. Furthermore, the crystallinity degradation of the n-type InAlGaN cap layer 4 otherwise caused in the annealing can be suppressed, so as to retain high crystallinity, and hence, the parasitic resistance can be reduced.

Although the multilayered film including at least one cycle of an InAlGaN layer and an AlGaN layer alternately stacked is used as the multilayered film 10 in this embodiment, the same effects can be attained even when a multilayered film includes at least one cycle of a GaN layer and an AlGaN layer alternately stacked.

Furthermore, although the crystals of the undoped GaN buffer layer 2, the n-type AlGaN electron supply layer 3 and the like are grown on the (0001) plane of the sapphire substrate 1 in each of Embodiments 1 and 2, the plane direction of the crystal growth face is not particularly specified. For example, a plane direction with an off angle against a typical plane such as the (0001 plane may be employed.

Although the sapphire substrate 1 is used in each of Embodiments 1 and 2, even when a substrate of SiC, GaN, AlN, Si, GaAs, ZnO, MgO, ZrB$_2$, LiGaO$_2$, LiAlO$_2$, GaP, InP or mixed crystal of at least two of them is used, a nitride semiconductor with high crystallinity can be epitaxially grown as in these embodiments.

Moreover, in each of Embodiments 1 and 2, the epitaxially grown layers (such as the GaN buffer layer 2 and the n-type AlGaN electron supply layer 3) included in the field effect transistor may have any composition ratio or any multilayered structure as far as desired device characteristics can be realized. Also, the crystal growth method for the epitaxially grown layers is not limited to the MOCVD but may be, for example, molecular beam epitaxy (MBE) or hydride vapor phase epitaxy (HVPE). Furthermore, the respective epitaxially grown layers may be formed by different crystal growth methods. Moreover, the epitaxially grown layers may include, as a composing element, a group V element such as As or P or a group III element such as B. Also, each epitaxially grown layer is not limited to the GaN-based semiconductor layer but may be a GaAs-based semiconductor layer or an InP-based semiconductor layer.

Specifically, although GaN and AlGaN are respectively used as the buffer layer 2 and the electron supply layer 3 in each of Embodiments 1 and 2, a combination of GaN and AlN, a combination of InAlGaN and AlN or a combination of InGaN and GaN may be used instead.

What is claimed is:
1. A field effect transistor comprising:
a nitride semiconductor layer;
an $In_xAl_yGa_{1-x-y}N$ layer (wherein 0<x<1, 0<y<1 and 0<x+y<1) formed on said nitride semiconductor layer; and
a source electrode and a drain electrode formed on and in contact with said $In_xAl_yGa_{1-x-y}N$ layer,
wherein lower ends of conduction bands of said nitride semiconductor layer and said $In_xAl_yGa_{1-x-y}N$ layer are substantially continuous on an interface therebetween,
said nitride semiconductor layer includes Al, and
Al composition in said nitride semiconductor layer is changed to be larger as a distance from the interface between said nitride semiconductor layer and $In_xAl_yGa_{1-x-y}N$ layer is larger.
2. The field effect transistor of claim 1,
wherein polarization of said $In_xAl_yGa_{1-x-y}N$ layer is equal to or larger than polarization of said nitride semiconductor layer.
3. The field effect transistor of claim 1,
wherein a lattice constant of said nitride semiconductor layer is substantially equal to a lattice constant of said $In_xAl_yGa_{1-x-y}N$ layer on the interface therebetween.

4. The field effect transistor of claim 1,
   wherein a band gap of said nitride semiconductor layer is substantially equal to a band gap of said $In_xAl_yGa_{1-x-y}N$ layer on the interface therebetween.

5. The field effect transistor of claim 1,
   wherein the Al composition in said nitride semiconductor layer is linearly increased as the distance from the interface is larger.

6. The field effect transistor of claim 1,
   wherein the Al composition in said nitride semiconductor layer is increased in a stepwise manner as the distance from the interface is larger.

7. The field effect transistor of claim 1,
   wherein the Al composition in said nitride semiconductor layer is increased in a shape of a quadratic curve upward convex as the distance from the interface is larger.

8. The field effect transistor of claim 1, further comprising, between said nitride semiconductor layer and said $In_xAl_yGa_{1-x-y}N$ layer, a multilayered film including at least one cycle of a GaN layer and an AlGaN layer alternately stacked.

9. The field effect transistor of claim 1, further comprising, between said nitride semiconductor layer and said $In_xAl_yGa_{1-x-y}N$ layer, a multilayered film including at least one cycle of an InAlGaN layer and an AlGaN layer alternately stacked.

10. The field effect transistor of claim 1,
    wherein said nitride semiconductor layer includes a portion doped with an impurity for providing a conductivity type of said nitride semiconductor layer in such a manner as to form a pulse-shaped profile along a direction vertical to the interface between said nitride semiconductor layer and said $In_xAl_yGa_{1-x-y}N$ layer.

11. The field effect transistor of claim 10,
    wherein a peak concentration of said impurity in said portion of said nitride semiconductor layer is $1 \times 10^{19}$ atoms/cm$^3$ or more.

12. The field effect transistor of claim 1, further comprising a gate electrode formed in a recess that is provided in a given portion of said $In_xAl_yGa_{1-x-y}N$ layer and reaches said nitride semiconductor layer.

* * * * *